United States Patent
Eroz et al.

(10) Patent No.: US 8,615,697 B2
(45) Date of Patent: *Dec. 24, 2013

(54) CODE DESIGN AND IMPLEMENTATION IMPROVEMENTS FOR LOW DENSITY PARITY CHECK CODES FOR WIRELESS ROUTERS USING 802.11N PROTOCOL

(75) Inventors: Mustafa Eroz, Germantown, MD (US); Lin-Nan Lee, Potomac, MD (US); Feng-Wen Sun, Germantown, MD (US)

(73) Assignee: The DIRECTV Group, Inc., El Segundo, CA (US)

( * ) Notice: Subject to any disclaimer, the term of this patent is extended or adjusted under 35 U.S.C. 154(b) by 1210 days.

This patent is subject to a terminal disclaimer.

(21) Appl. No.: 12/496,443

(22) Filed: Jul. 1, 2009

(65) Prior Publication Data
US 2010/0005363 A1    Jan. 7, 2010

Related U.S. Application Data

(63) Continuation of application No. 11/222,084, filed on Sep. 8, 2005, now Pat. No. 7,562,280.

(60) Provisional application No. 60/608,837, filed on Sep. 10, 2004.

(51) Int. Cl.
*H03M 13/00* (2006.01)

(52) U.S. Cl.
USPC .......................................... 714/758; 714/776

(58) Field of Classification Search
USPC ............................................. 714/758, 776
See application file for complete search history.

(56) References Cited

U.S. PATENT DOCUMENTS

| | | | | |
|---|---|---|---|---|
| 6,633,856 | B2 * | 10/2003 | Richardson et al. | 706/15 |
| 6,895,547 | B2 * | 5/2005 | Eleftheriou et al. | 714/801 |
| 7,324,605 | B2 * | 1/2008 | Maltsev et al. | 375/299 |
| 7,394,858 | B2 * | 7/2008 | Sadowsky et al. | 375/260 |
| 2002/0122383 | A1 | 9/2002 | Wu et al. | |
| 2004/0218682 | A1 | 11/2004 | Nam et al. | |
| 2005/0180386 | A1 | 8/2005 | Hansen et al. | |
| 2005/0283709 | A1 * | 12/2005 | Kyung et al. | 714/758 |

OTHER PUBLICATIONS

Translated Japanese Office action dated Dec. 21, 2010 in Japanese Patent Application No. 2008-530195 filed Sep. 8, 2006 by Mustafa Eroz et al.

Molisch, Andreas F. et al.; "Physical (PHY) Layer and Medium Access Control (MAC) Layer Proposal for IEEE 802.11n"; Sep. 2004; XP002410953; URL: http://www.ieee802.org/11/DocFiles/04/11-04-0959-02-000n-mitsubishi-merl-phy-and-mac-proposal-802-11n.doc.

(Continued)

*Primary Examiner* — M. Mujtaba K Chaudry

(57) ABSTRACT

Method and apparatus for implementing LDPC codes in an IEEE 802.11 standard system configured to operate in a Multiple-Input, Multiple-Output (MIMO) schema. A method in accordance with the present invention comprises defining a base LDPC code, having a length equal to an integer number of data carriers in an ODFM symbol, transmitting the base LDPC code over a plurality of sub-carriers, wherein the base code is transmitted at an expected phase on sub-carriers specified by the IEEE 802.11 standard system, and transmitting the base LDPC code on other sub-carriers than those specified by the IEEE 802.11 standard system, wherein the base LDPC code on the other sub-carriers is transmit offset in phase from the base LDPC code on the specified sub-carriers.

20 Claims, 18 Drawing Sheets

(56) References Cited

OTHER PUBLICATIONS

Kaiser, Stefan; "Spatial Transmit Diversity Techniques for Broadband OFDM Systems"; Institute of Electrical and Electronics Engineers; GlobeCom 2000; Nov. 27-Dec. 1, 2000; IEEE Global Telecommunications Conference; New York, New York; vol. 3 of 3; pp. 1824-1828; XP001195742; ISBN: 0-7803-6452-X.

Dammann, Armin et al.; "Beamforming in Combination with Space-Time Diversity for Broadband OFDM Systems"; 2002 IEEE International Conference on Communications; Conference Proceedings; New York, New York; vol. 1 of 5; pp. 165-171; Apr. 28, 2002; XP010589479; ISBN: 0-7803-7400-2.

Bangerter, Boyd et al.; "High-Throughput Wireless LAN Air Interface"; Intel Technology Journal; vol. 7, No. 3; Aug. 19, 2003; pp. 47-57; XP002322699.

Matolak, David W. et al.; "Adaptive Data Rate Multi-Carrier Direct-Sequence Spread Spectrum in Rayleigh Fading"; Vehicular Technology Conference; 2004 IEEE 60$^{th}$; Los Angeles, California; Sep. 26-29, 2004; pp. 349-352; XP010786681; ISBN: 0-7803-8521-7.

PCT International Preliminary Examination Report dated Oct. 13, 2008 in International Application No. PCT/US2006/034851 filed Sep. 8, 2006 by Mustafa Eroz et al.

EPO Communication dated Jul. 23, 2008 in European Patent Application No. 06803113.7 filed Sep. 8, 2006 by Mustafa Eroz et al.

Chinese Office action dated May 11, 2010 in Chinese Patent Application No. 200680032866.4 filed Sep. 8, 2006 by Mustafa Eroz et al.

\* cited by examiner

CODE DESIGN AND IMPLEMENTATION IMPROVEMENTS FOR LOW DENSITY PARITY CHECK CODES FOR WIRELESS ROUTERS USING 802.11N PROTOCOL

CROSS-REFERENCE TO RELATED APPLICATIONS

This application is a continuation of U.S. Utility patent application Ser. No. 11/222,084, filed Sep. 8, 2005, entitled "CODE DESIGN AND IMPLEMENTATION IMPROVEMENTS FOR LOW DENSITY PARITY CHECK CODES FOR WIRELESS ROUTERS USING 802.11N PROTOCOL", which claims the benefit under 35 U.S.C. Section 119(e) of the following commonly-assigned U.S. provisional patent application, which is incorporated by reference herein:

Provisional Application Ser. No. 60/608,837, filed Sep. 10, 2004, by Mustafa Eroz et al., entitled "HNS PROPOSAL FOR 802.11n PHYSICAL LAYER."

BACKGROUND OF THE INVENTION

1. Field of the Invention

The present invention relates generally to a digital signal delivery systems, and in particular, to design and implementation for Low Density Parity Check (LDPC) codes for multiple-input, multiple-output channels within a digital signal delivery system.

2. Description of the Related Art

Radio Frequency (RF) transmission of information has become commonplace. Typically, a single transmit antenna sends a signal which can be received by one or more receive antennas. Examples of such systems include satellite broadcasts, such as satellite television broadcasting, radio, and cellular telephone systems.

Because of the ease of use of such systems, larger and larger demands for higher speed data transfer through such systems have taken place. Wireless internet access, which requires the transfer of large amounts of data for pictures, audio, and other data requires a large throughput via a single transmit antenna system. Many of these systems are now reaching their data throughput limits, making it difficult to provide wireless data transfer in areas that such services are desired.

There is a current movement to have Multiple Input Multiple Output (MIMO) systems that employ multiple transmit antennas and multiple receive antennas to increase the data throughput. Examples of MIMO systems are wireless Local Area Networks (LANs), Bluetooth networks, and high-speed wireless (Wi-Fi) networks. MIMO systems use multiple signal paths, which in standard systems would cause multipath errors and interference, to transmit additional data from one place to another. Algorithms for properly transmitting and subsequently recombining the MIMO transmitted data at the receiver must be conceived and transmitted along with the MIMO data for such systems to properly function.

MIMO systems theoretically double the spectral efficiency compared with that of single transmit antenna systems. Just as with single transmit antenna systems, the data frames in a MIMO system are coded in such a manner that they can interfere with each other, and MIMO receivers cannot tell which packets of data goes first, or whether the data within a given frame is corrupted by constructive or destructive interference. Such interference is called "co-channel" interference, where one channel of data interferes with the reception and demodulation of another channel of data. In practical applications, the co-channel interference may also stem from transmission of other system operators or other spot transmission beams in a MIMO system. As MIMO systems transmit more data, the interference between data packets will increase, and, as such, the quality of the signal reception will be poorer.

To ensure that transmission systems can properly decode transmitted data, error correction codes, specifically, Forward Error Correction (FEC) codes are used. However, in MIMO systems, FEC codes cannot be chosen randomly because of the potential interference of these codes with each other.

Traditionally, the negative effects of such interference have been minimized by redesigning the frequency assignments assigned to the various transmitters and receivers. However, since the frequencies are fixed by standard, frequency reassignment or frequency reuse will not alleviate the problem beyond a certain point.

It can be seen, then, that there is a need in the art to minimize the interference in a broadcasting system. It can also be seen that there is a need in the art for proper selection of FEC codes in a MIMO system.

SUMMARY OF THE INVENTION

To minimize the limitations in the prior art, and to minimize other limitations that will become apparent upon reading and understanding the present specification, the present invention discloses a method and apparatus for implementing LDPC codes in an IEEE 802.11 standard system configured to operate in a Multiple-Input, Multiple-Output (MIMO) schema. A method in accordance with the present invention comprises defining a base LDPC code, having a length equal to an integer number of data carriers in an ODFM symbol, transmitting the base LDPC code over a plurality of sub-carriers, wherein the base code is transmitted at an expected phase on sub-carriers specified by the IEEE 802.11 standard system, and transmitting the base LDPC code on other sub-carriers than those specified by the IEEE 802.11 standard system, wherein the base LDPC code on the other sub-carriers is transmit offset in phase from the base LDPC code on the specified sub-carriers.

The method optionally includes a base LDPC code being 192 bits long, a length of the longer LDPC code is an integer multiple of the base LDPC code, the specified sub-carriers are transmitted by a first transmission antenna and the other sub-carriers are transmitted by at least one other antenna, and transmitting bits of the longer LDPC code sequentially on the specified sub-carriers and the other sub-carriers.

A system in accordance with the present invention comprises an encoder, for receiving a base LDPC code having a length equal to an integer number of data carriers in an ODFM symbol, and for encoding information bits using the LDPC code, a modulator, coupled to the encoder, for modulating the encoded information bits, and a transmitter, coupled to the modulator, for transmitting the modulated encoded information bits on a plurality of transmit antennas, wherein the modulated encoded information bits are transmitted on sub-carriers specified by an IEEE 802.11 standard system.

Such a system optionally includes a plurality of receive antennas for receiving the transmitted modulated encoded information bits, a detector, coupled to the antennas, for detecting the presence of the transmitted modulated encoded information bits, an LDPC decoder, coupled to the detector, for decoding the transmitted modulated encoded information bits, and a demodulator, coupled to the LDPC decoder, for demodulating the transmitted modulated encoded information bits, the base LDPC code being 192 bits long, a longer LDPC code, wherein a length of the longer LDPC code is an integer multiple of the base LDPC code, transmitting bits of the longer LDPC code sequentially on the specified sub-carriers and other sub-carriers, and the specified sub-carriers being transmitted by a first transmission antenna and other sub-carriers are transmitted by at least one other antenna.

Other features and advantages are inherent in the system and method claimed and disclosed or will become apparent to those skilled in the art from the following detailed description and its accompanying drawings.

BRIEF DESCRIPTION OF THE DRAWINGS

Referring now to the drawings in which like reference numbers represent corresponding parts throughout.

DETAILED DESCRIPTION OF PREFERRED EMBODIMENTS

In the following description, reference is made to the accompanying drawings which form a part hereof, and which show, by way of illustration, several embodiments of the present invention. It is understood that other embodiments may be utilized and structural changes may be made without departing from the scope of the present invention.

Overview

The present invention uses Low Density Parity Check (LDPC) codes to increase the performance of MIMO systems, within a few dB of the theoretical limit of such systems, without unduly increasing the complexity of the circuitry needed to generate and decode the LDPC codes of the present invention.

LDPC codes were discovered by Gallager in 1962, but they were not given much attention for decades as the technology at the time was not mature for efficient implementation. Motivated by the success of iterative decoding of turbo codes, LDPC codes were reintroduced in 1995, generating great interest and activity on the subject. Unlike turbo codes, LDPC codes have an easily parallelizable decoding algorithm which consists of simple operations such as addition, comparison and table look-up. Despite the simplicity of the decoding algorithm and operations, the challenge in the design is how to establish the communication between "randomly" distributed bit nodes and check nodes.

A fully parallel architecture where there are as many physical nodes in the circuit as the logical nodes of the code becomes rapidly infeasible with increasing block size due to complexity of interconnections between the nodes. However, for a partially parallel architecture, where a small number of physical nodes are re-used to serve all the logical nodes, the main problem is to access relevant information for the logical nodes in process, fast enough from memory in high speed applications.

Multiple-antenna input multiple-antenna output systems have recently gained popularity as an effective way to combat multi-path fading channels. Space time codes were introduced to maximize the diversity and coding gain for these systems. However, the coding gain delivered by reasonable complexity space-time codes are not sufficient. As a result, performance of space-time codes fall far away from what can be achieved.

The present invention replaces the space-time codes with LDPC codes to improve the performance of MIMO systems. Further, the present invention illustrates the method for generating proper LDPC codes for such systems to increase data throughput and improve performance.

System Diagram

Figure 1:
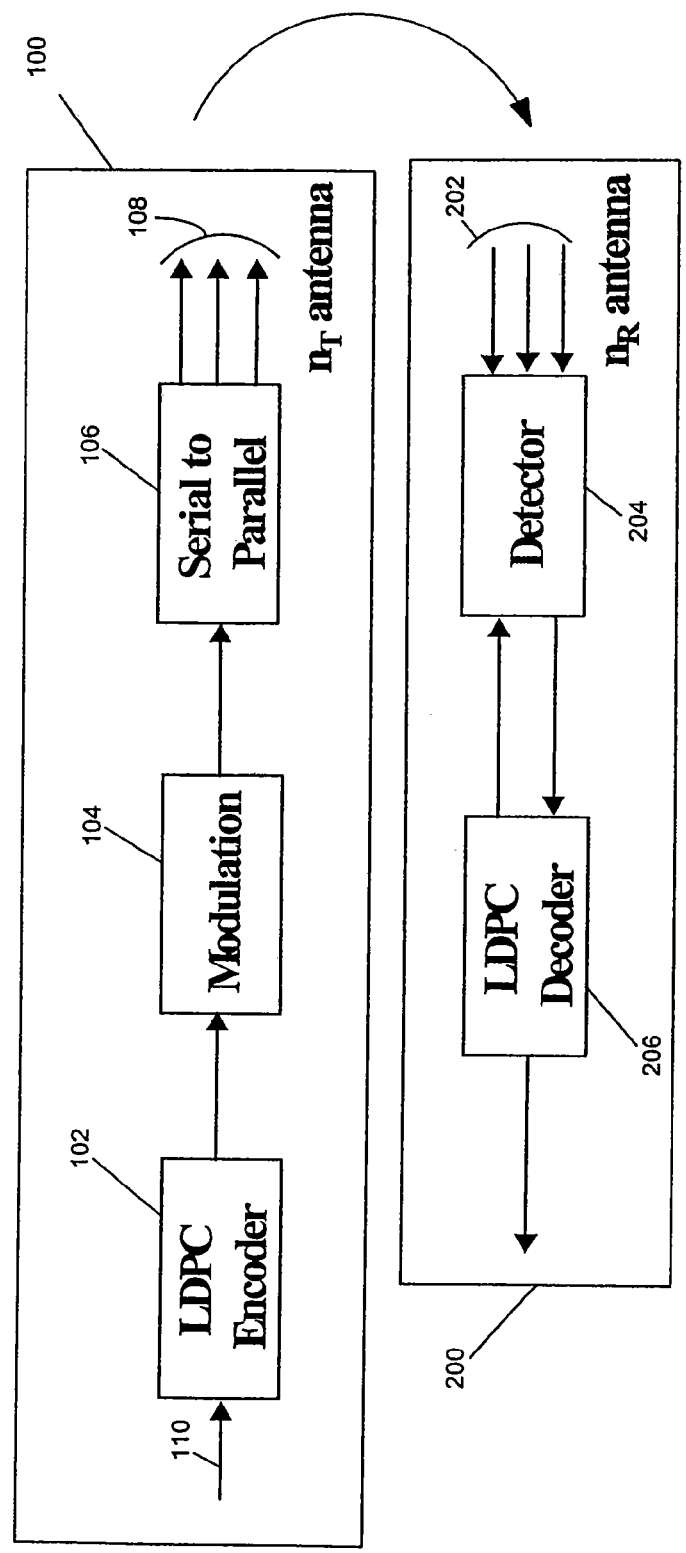
FIG. 1 illustrates a system block diagram of an LDPC-coded MIMO system of the present invention.

FIG. 1 illustrates a system block diagram of an LDPC-coded MIMO system of the present invention.

Transmitter 100 and receiver 200 are shown in a MIMO system. Within transmitter 100, there is an LDPC encoder 102, modulator 104, and a Serial-to-Parallel module 106, which feeds multiple antenna feeds 108. Within receiver 200, there are multiple antenna feeds 202, which are input to detector 204, which communicates with LDPC decoder 206. Additionally, orthogonal frequency division multiplexing and other circuitry can be inserted between modulator/detector and the channel without affecting the scope of the present invention.

For a MIMO system, the LDPC encoder 102 and LDPC decoder 206 of the present invention replace other FEC (e.g., turbo codes) generators. However, because of the potential complexity of LDPC codes, the present invention generates the LDPC codes in a specific way for use in a MIMO system.

In broadcast applications, such as MIMO systems, continuous mode receivers are widely used. Codes that perform well in low signal-to-noise (SNR) environments are at odds with these receivers 105 with respect to synchronization (e.g., carrier phase and carrier frequency). Many digital broadcast systems require use of additional training symbols beyond that of the normal overhead bits in a frame structure for their synchronization processes. The increase in overhead is particularly required when the Signal-to-Noise (SNR) is low; such an environment is typical when high performance codes are used in conjunction with high order modulation. Traditionally, continuous mode receivers utilize a feedback control loop to acquire and track carrier frequency and phase. Such approaches that are purely based on feedback control loops are prone to strong Radio Frequency (RF) phase noise and thermal noise, causing high cycle slip rates and an error floor on the overall receiver performance. Thus these approaches are burdened by increased overhead in terms of training symbols for certain performance target, in addition to limited acquisition range and long acquisition time. Further, these conventional synchronization techniques are dependent on the particular modulation scheme, thereby hindering flexibility in use of modulation schemes.

The LDPC or other FEC code or codes that are generated by the transmitter 100 facilitate high speed implementation without incurring any performance loss. These structured LDPC codes output from the transmitter 100 avoid assignment of a small number of check nodes to the bit nodes already vulnerable to channel errors by virtue of the modulation scheme (e.g., 8PSK). Such LDPC codes have a parallelizable decoding process, unlike turbo codes, which advantageously involves simple operations such as addition, comparison and table look-up. Moreover, carefully designed LDPC codes do not exhibit any sign of error floor, e.g., there is no decrease in errors even though the signal-to-noise ratio increases. If an error floor were to exist, it would be possible to use another code, such as a Bose/Chaudhuri/Hocquenghem (BCH) code or other codes, to significantly suppress such error floor.

According to one embodiment of the present invention, the transmitter 100 generates, using a relatively simple encoding technique as explained herein below, LDPC codes based on parity check matrices which facilitate efficient memory access during decoding to communicate with receiver 200 in a MIMO system.

Transmitter 100 uses LDPC encoder 102 that accepts input 110 from an information source and outputs a coded information stream of higher redundancy suitable for error correction processing at the receiver 200. The information source generates k signals from a discrete alphabet, X. LDPC codes are specified with parity check matrices. Encoding LDPC codes requires, in general, specifying the generator matrices.

LDPC Encoder 203 generates signals using the input 110 and passes these signals to a modulator 205, using a simple encoding technique that makes use of only the parity check matrix by imposing structure onto the parity check matrix. Specifically, a restriction is placed on the parity check matrix by constraining certain portions of the matrix. Such a restriction results in negligible performance loss, and therefore, constitutes an attractive trade-off.

Transmission Schema

As shown in FIG. 1, there are $n_T$ transmit antennas 108 and $n_R$ receive antennas 202. The transmission for one channel is represented as r=A s+n, where
$s=[s_1, s_2, \ldots, s_{n_T}]$ is the transmitted symbol vector,
$r=[r_1, r_2, \ldots, r_{n_R}]$ is the received symbol vector $$A = \begin{bmatrix} a_{1,1} & a_{1,2} & \cdots & a_{1,n_T} \\ a_{2,1} & a_{2,2} & \cdots & a_{2,n_T} \\ \vdots & \vdots & \vdots & \vdots \\ a_{n_R,1} & a_{n_R,2} & \cdots & a_{n_R,n_T} \end{bmatrix}$$

is the complex fade values matrix between each pair of antennas, where $|a_{i,j}|$ is assumed Rayleigh distributed. and n is the Average White Gaussian Noise (AWGN) noise vector.

For A matrices of subsequent channel uses, there are two extreme cases of interest, namely where A changes independently for each channel use (i.e. ideal interleaving), and where A is constant for the entire FEC frame (i.e. quasi-static fading).

The present invention applies specific LDPC codes for the MIMO channels described with the linear algebra described above. Maintaining high performance of the LDPC codes within the MIMO channels while maintaining an easy memory access feature of the subset of possible LDPC codes is an important feature of the code selection.

Design of the LDPC Codes and Constellation Bit Labelings

Figure 2:
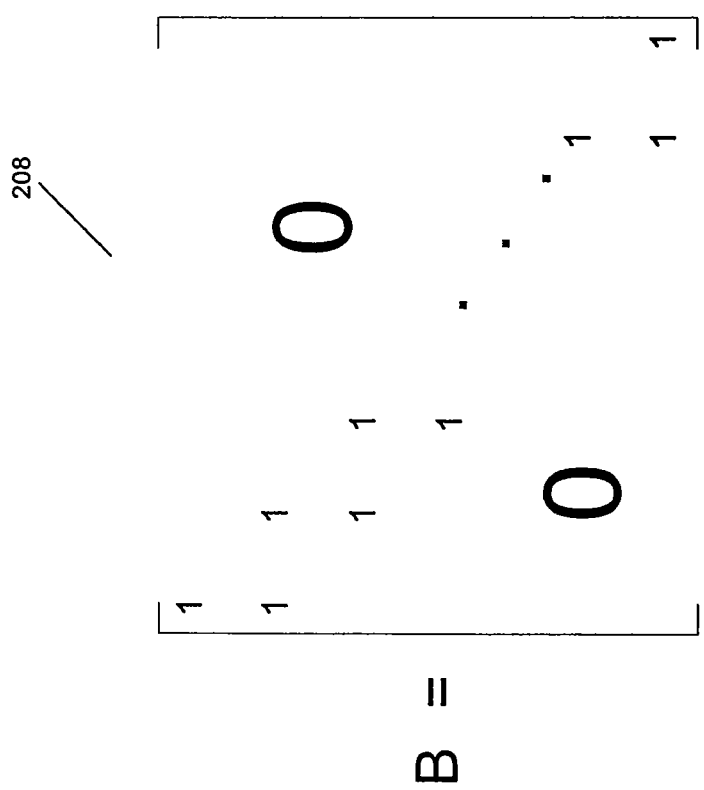
FIG. 2 illustrates a submatrix of the parity check matrix of the present invention.

FIG. 2 illustrates a submatrix of the parity check matrix of the present invention.

The present invention restricts the parity check matrix of the LDPC codes as follows:

For a group of M bit nodes, if the check nodes connected to the first bit node of degree, say $d_v$, are numbered as $a_1, a_2, \ldots, a_{d_v}$, then the check nodes connected to $i^{th}$ bit node (i≤M) are numbered as, $\{a_1+(i-1)q\} \mod(N-K), \{a_2+(i-1)q\} \mod(N-K), \ldots, \{a_{d_v}+(i-1)q\} \mod(N-K)$ where N−K=total number of check nodes and $$q = \frac{N-K}{M}.$$

For the following groups of M bit nodes, the check nodes connected to the first bit node of the group are in general randomly chosen so that at the end, all check nodes have the same degree, except for one check node with one less degree. Furthermore, the present invention includes a random search over these free constants $a_1, a_2, \ldots, a_{d_v}$, i.e., check nodes connected to the first bit node in every group of M so that the resulting LDPC code has optimum performance on MIMO channels. Moreover the imposed structure on the parity check matrix 208 definition leads to efficient memory access.

In addition to the previous restriction, the parity check matrix is restricted to be of the form, $H_{(N-K) \times N}=[A_{(N-K) \times K} B_{(N-K) \times (N-K)}]$ where B is staircase lower triangular as shown in FIG. 2, in other words only the $A=[a_{mn}]$ sub-matrix 208 is chosen according to the previous paragraph. From the structure of the B sub-matrix 208, the first check node has one less degree than the others.

Further, the LDPC encoder 102 of the present invention systematically encodes an information block i of size k, e.g., $i=(i_0, i_1, \ldots, i_{k-1})$ onto a codeword c of size n, e.g., $c=(i_0, i_1, \ldots, i_{k-1}, p_0, p_1, \ldots p_{n-k-1})$. The transmission of the codeword starts in the given order from $i_0$ and ends with $p_{n-k-1}$. The n codeword bits are first mapped to n/C constellation symbols where $2^C$ is the constellation size. The modulated symbols are then sent through $n_T$ transmit antennas in $n/(C \times n_T)$ channel use. LDPC code parameters (n,k) are given in Table 1 for various code rates. The number of bit nodes with corresponding degrees are shown in Table 2.

The task of the encoder 102 is to determine n-k parity bits $(p_0, p_1, \ldots, p_{n-k-1})$ for every block of k information bits, $(i_0, i_1, \ldots, i_{k-1})$. A number of parallel engines are chosen, and each parallel engine accumulates information bits at specific parity bit addresses. Then, a first information bit, $i_0$, is accumulated at specific parity bit addresses, namely, at specified parity bit addresses, with a code rate dependent offset for each increase in information bit.

Continuing with the present example, the accumulation for the next number of information bits is done at parity bit addresses $\{x+m \mod 400 \times q\} \mod(n-k)$ where x denotes the address of the parity bit accumulator corresponding to the first bit $i_0$, and q is a code rate dependent offset constant.

As the first set of accumulations for each of the parallel engines complete, there will be additional information bits that need to be processed. In the example, there are M parallel engines, and when the $M+1^{st}$ information bit is reached, accumulations must also occur.

For the $M+1^{st}$ information bit, the present invention switches the location of where the accumulation takes place.

The addresses of the parity bit accumulators for the next number of parallel engine calculations are performed at different parity bit addresses. In a similar manner the addresses of the parity bit accumulators for the following M information bits are obtained using the formula {x+m mod 400×q} mod (n−k) where x denotes the address of the parity bit accumulator corresponding to the information bit.

In a similar manner, for every group of M new information bits, a new set of parity bit addresses are selected to find the addresses of the parity bit accumulators. After all of the information bits are exhausted, the final parity bits are obtained as follows, Sequentially perform the following operations starting with i=1, i.e., $p_i = p_i \oplus p_{i-1}$, i=1, 2, . . . , n−k−1, and the final content of $p_i$, i=0, 1, . . . , n−k−1 is equal to the parity bit $p_i$.

The LDPC encoded bits fill a two-dimensional interleaver matrix column by column. The matrix has 3 columns for 8-PSK modulation, 4 columns for 16-QAM modulation, 5 columns for 32-QAM modulation and 6 columns for 64-QAM modulation. Then each row of the matrix is mapped to a constellation symbol according to the bit labelings in FIG. 3. With QPSK no interleaving is performed. The span of the interleaving is one LDPC frame length.

At the receiver, LDPC decoder and detector iterate soft information back and forth to improve the performance. A detector iteration is performed after every three LDPC decoder iteration.

Performance Results

Figure 3A:
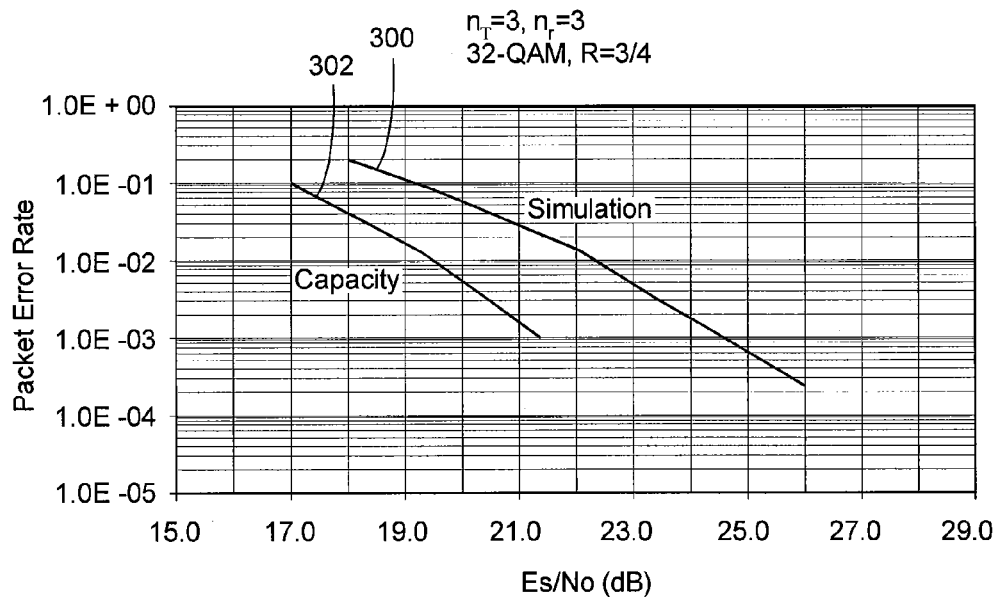
FIGS. 3A-3C illustrate simulations of the performance of the present invention.
Figure 3B:
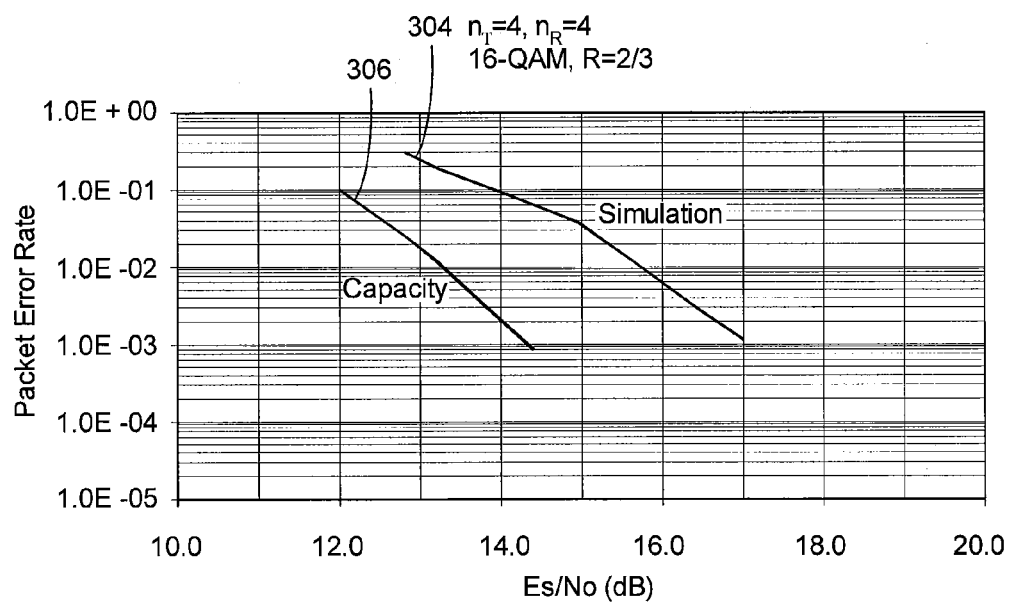
Figure 3C:
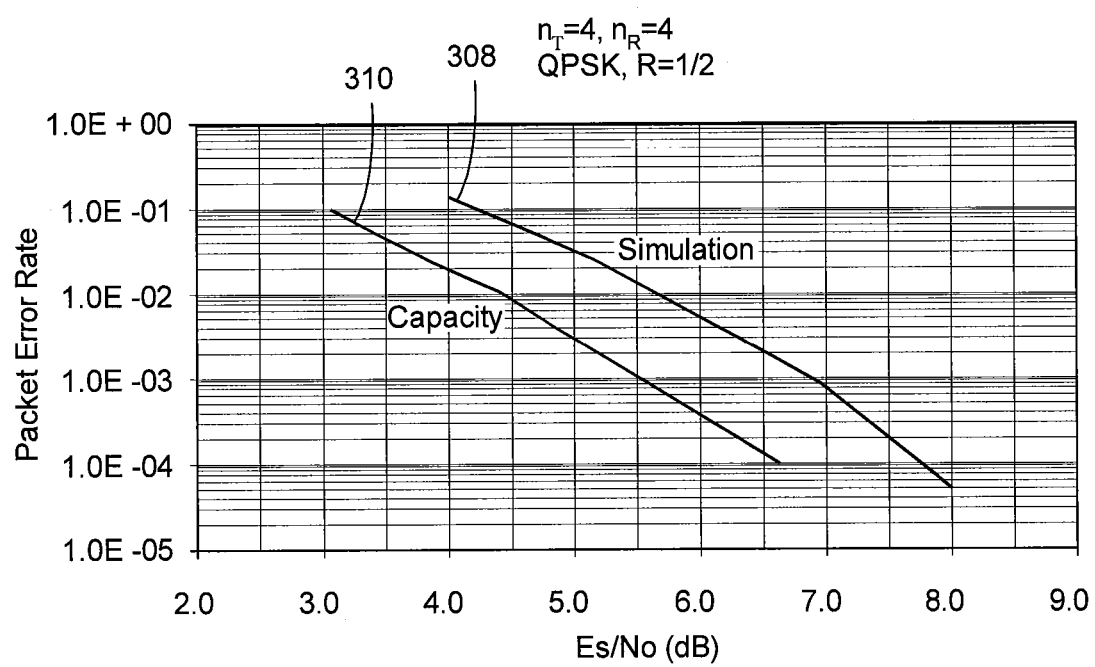

FIGS. 3A-3C illustrate simulations of the performance of the present invention.

Performance results of the codes of the present invention are shown in FIGS. 3A-3B. FIG. 3A shows the simulated performance 300 of a quasi-static fading channel in a MIMO system having 3 transmit antennas and 3 receive antennas, using a 32-QAM code at rate ¾, with Shannon capacity 302 shown for comparison.

FIG. 3B shows the simulated performance 304 of a quasi-static fading channel in a MIMO system having 4 transmit antennas and 4 receive antennas, using a 64-QAM code at rate ⅔, with Shannon capacity 306 shown for comparison. FIG. 3C shows the simulated performance 308 of a quasi-static fading channel in a MIMO system having 4 transmit antennas and 4 receive antennas, using a QPSK code at rate ½, with Shannon capacity 310 shown for comparison.

The performance of the iterative LDPC decoder/MIMO detector of the present invention is approximately 1.5 dB away from the Shannon limit at FER=$10^{-2}$.

Figure 4A:
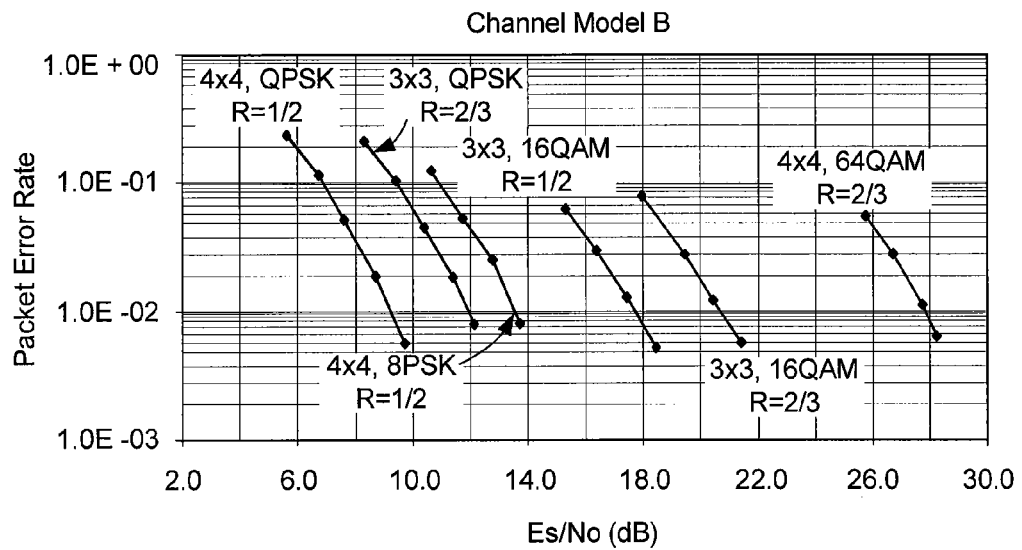
FIGS. 4A-4C illustrate simulations of the performance of short block length LDPC codes of the present invention.
Figure 4B:
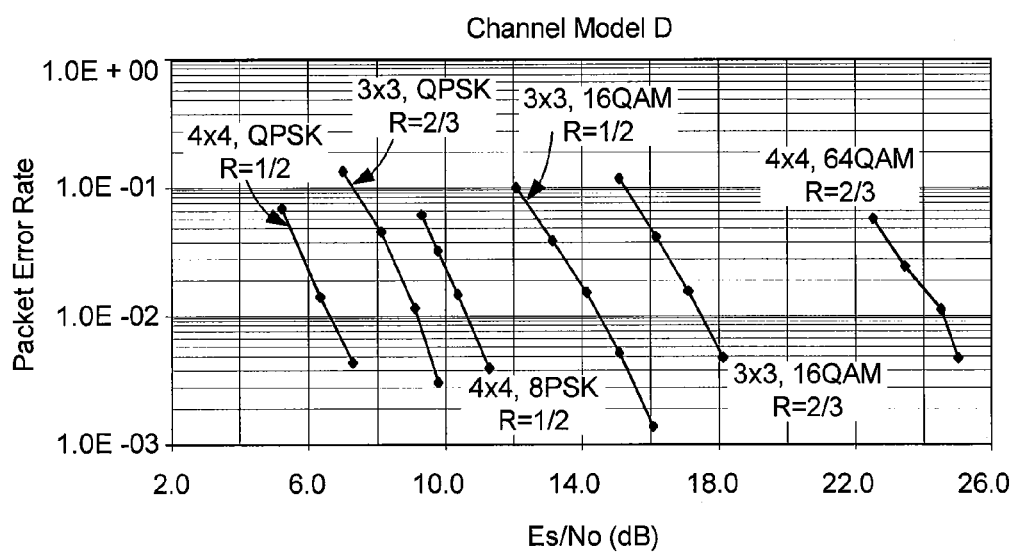
Figure 4C:
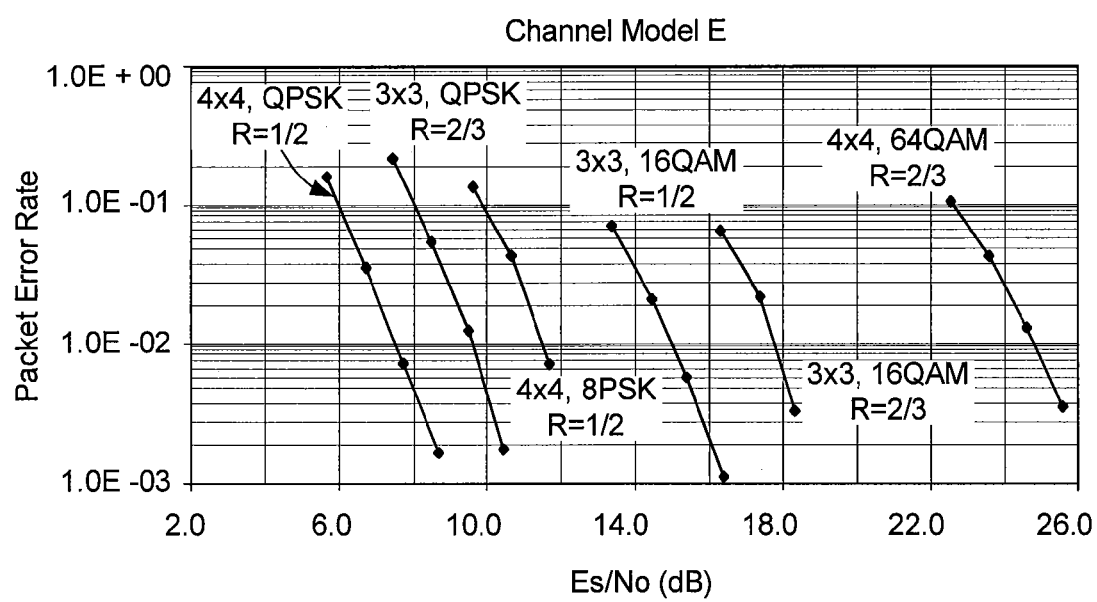

FIGS. 4A-4C illustrate simulations of the performance of short block length LDPC codes of the present invention.

For certain wireless LAN applications where the channel is very slowly fading, increasing the block length of codes generated by LDPC decoder 206 may not yield good enough performance to justify the extra complexity. In these scenarios, short block length LDPC codes with fully parallel decoding architecture may be preferable. Tables 8 and 9 show the parity check matrices of two LDPC codes with rates ½ and ⅔. Code length in each case is N=192. The $i^{th}$ row in the tables gives the check nodes connected to the $i^{th}$ bit node.

Applicability of LDPC Codes to 802.11 Standard

In recent wireless networks, the Institute of Electrical and Electronics Engineers (IEEE) standard 802.11a (1999) and follow on standards, e.g., 802.11b, 802.11g, etc., have been adopted for use in wireless computer Local Area Networks (LANs). The 802.11a standard uses Orthogonal Frequency Division Multiplexing (OFDM) modulation, using Phase Shift Keying (PSK) and Quadrature Amplitude Modulation (QAM) schema, with forty-eight data carriers and four pilot carriers in a fifty-three sub-carrier set of frequencies, where the center frequency is not used.

In a MIMO system, the preamble of the header information of the 802.11a transmission scheme is modified to be compatible with the 802.11a air interface, but still allow for multiple transmission antennas or a single transmit antenna for legacy 802.11a support.

Figure 5:
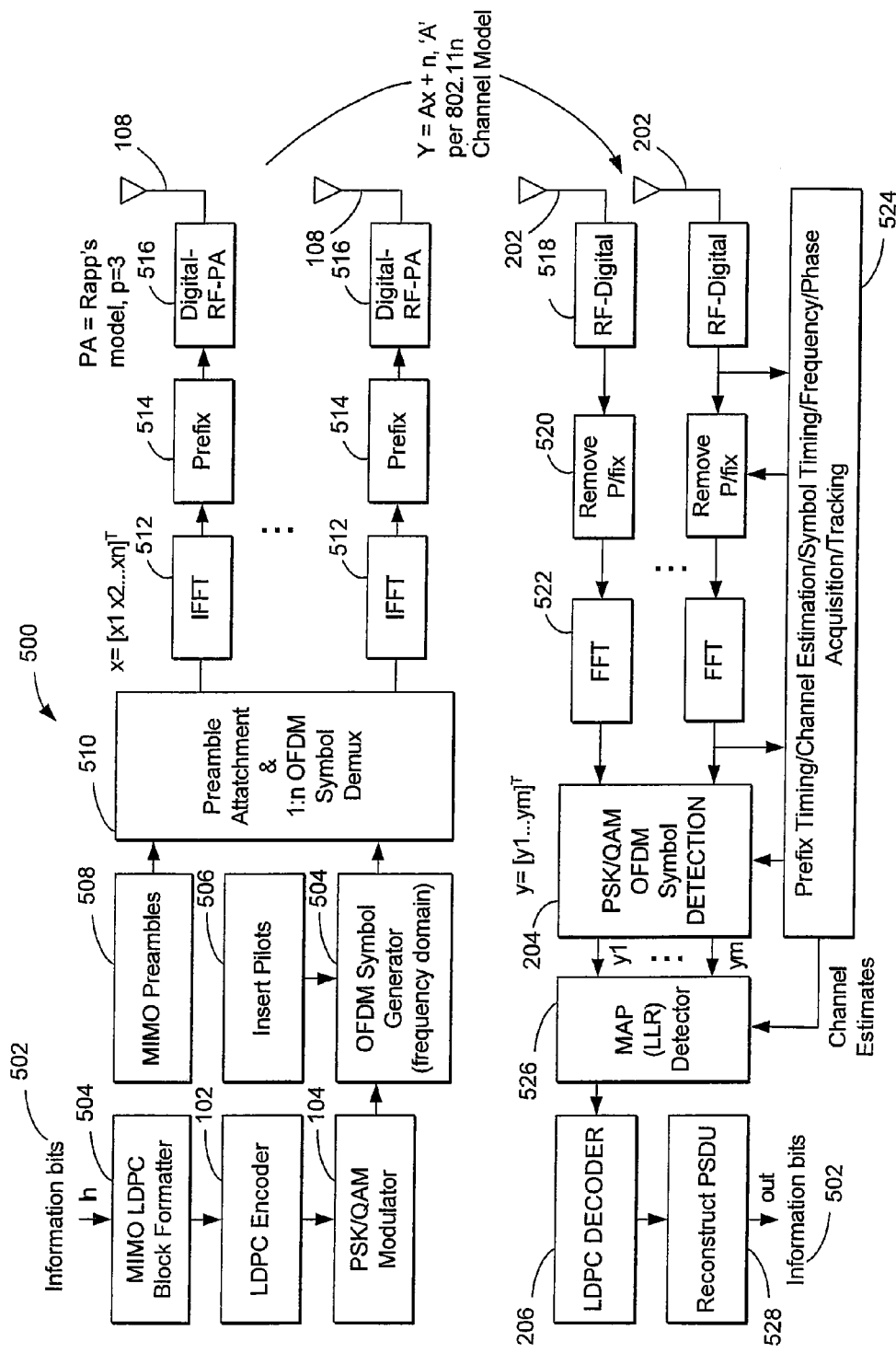
FIG. 5 illustrates a block diagram of an n×m MIMO system.

FIG. 5 illustrates a block diagram of an n×m MIMO system.

System 500 uses information bits 502 and enters the information bits into a MIMO LDPC block formatter 504 and then routes the bits into LDPC encoder 102. The encoded information is then fed into a modulator 104, and then a symbol generator 504. Pilot inserter 506 inserts the pilot symbols into symbol generator 504. MIMO preamble generator 508 and symbol generator 504 output their data to demultiplexer 510, which has n channels of output for each of n transmit antennas 108. Each channel is Inverse Fast Fourier Transformed by IFFT 512, a prefix 516 is attached, and the signal is digitally converted to an RF signal 516, which is broadcast via antennas 108.

The signal is then received by antennas 202, converted from an RF signal to a digital signal 518, prefix remover 520 takes the prefix from the signal, and the signal is then Fast Fourier Transformed (FFT'd) at FFT 522. A timing block 524 is used to estimate the channel and acquire and track the signal.

The timing block 524 and FFT 522 output signals to the symbol detector 204, and a maximum a posteriori (MAP) and log-likelihood ratio (LLR) detector 526 is used to detect a channel of the MIMO system. Once a channel is detected, the symbols on the channel is fed into the LDPC decoder 206, which then uses framing sequencer 528 reconstructs the Physical sublayer Service Data Units (PSDU) to re-create the information bits 502 that were transmitted.

802.11 Schema Application

The present invention provides for a family of high-performance FEC codes, specifically LDPC codes, that are optimized for the 802.11 transmission schemas. The codes of the present invention are capable of decoding air-transmitted information at an information rate close to 200 Mbps, and are flexible enough to support short and long packets without significant compromise in throughput in an 802.11-compatible MIMO system with up to four transmit antennas.

Because of the inherent parallel architecture, LDPC decoders are more suitable for high-speed operation than turbo decoders. By selecting LDPC codes having a block length equal to an integer number of OFDM channels, the efficiency of the LDPC codes are maximized, since there is no unnecessary padding or shortening of the LDPC code block. Longer codes become more inefficient for the transmission of short bursts of data, which is becoming a larger percentage of the traffic on 802.11 interfaces due to video game usage, Voice over Internet Protocol (VoIP), and other short data burst packet deliveries. Further, decoders for shorter codes are easier to implement, and are therefore desirable from cost and implementation standpoints.

As such, a base LDPC code of block length 192 bits, which is four times the number of data carriers (4×48) in an OFDM system, is an excellent baseline for the LDPC code length. However, recognizing the need for longer codes in some systems or for some data structures or data traffic expectations, such longer codes can be created by using integer number of increments of the 192 bit LDPC codes.

Training Preambles

Figure 6:
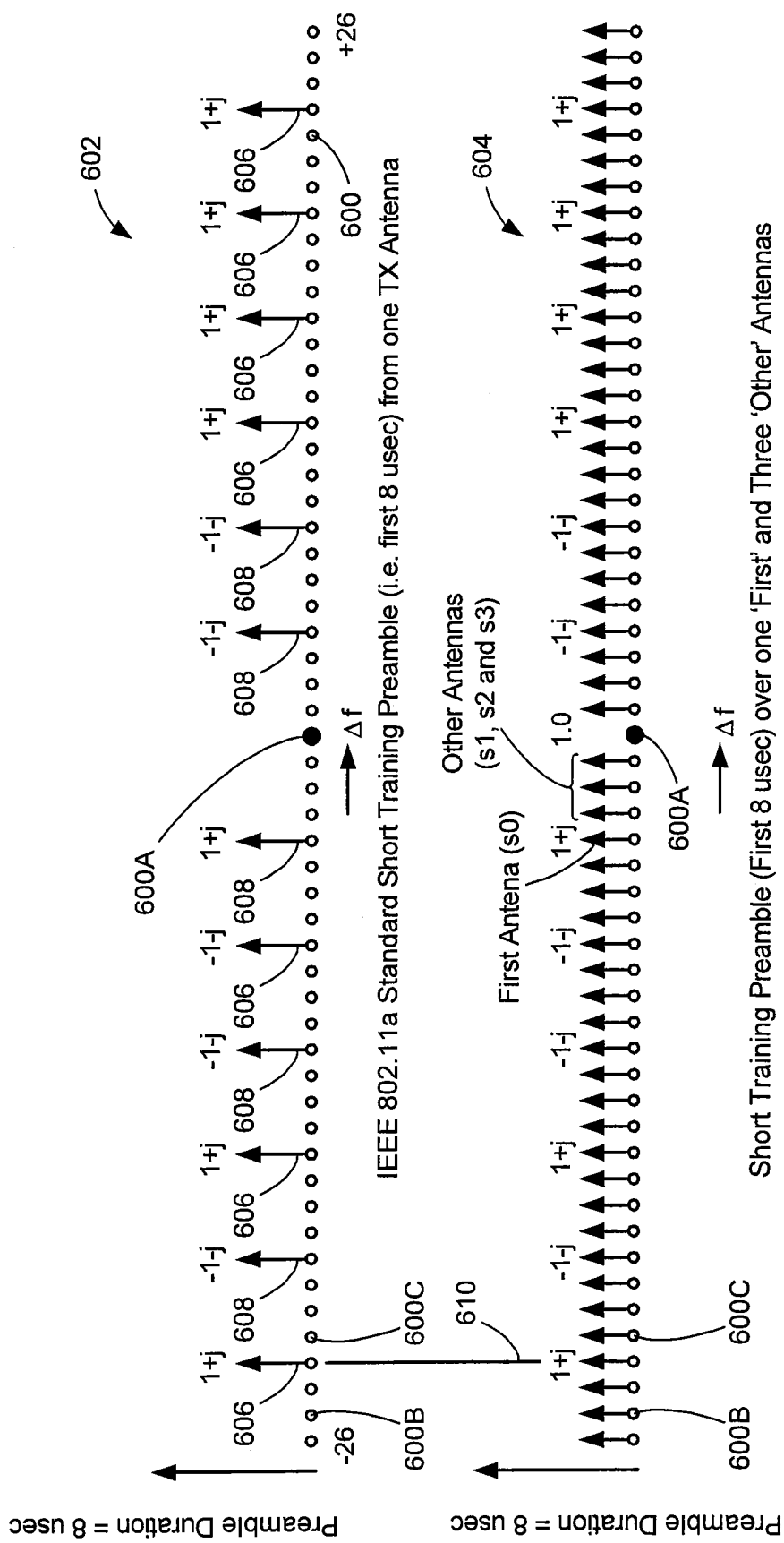
FIG. 6 illustrates the standard short training preamble from a single transmit antenna and the short training preamble for a MIMO system in accordance with the present invention.

FIG. 6 illustrates the standard short training preamble from a single transmit antenna and the short training preamble for a MIMO system in accordance with the present invention.

The fifty-three sub carriers 600 are shown, typically indexed as −26, −25, . . . 1, 0, 1, . . . 25 26, with the center sub carrier (the "0" sub-carrier) 600a shown as not transmitting any signaling either the standard short training preamble scenario 602 or the short training preamble scenario 604 of the present invention. The preamble is typically modulated by a 127 bit long Pseudo-Noise (PN) code, typically generated by an $x^7+x^4+1$ polynomial. The preamble duration is typically 8 microseconds.

In the standard scenario 602, only some of the sub-carriers 600 transmit a preamble, as shown by the arrows 606 and 608. Arrow 606 represents a transmission of the preamble with a 1+j phase, and arrow 608 represents a transmission of the preamble with a −1−j phase.

In scenario 604, each of the sub-carriers 600 is transmitting, except for center sub-carrier 600a. Alignment 610 shows that the arrow 606 in scenario 602 aligns with arrow 606 in scenario 604. However, where in scenario 602 there is no transmission on adjacent sub-carriers near alignment 610, e.g., sub-carriers 600B and 600C are not transmitting any signal), in scenario 604, these subcarriers 600B and 600C transmit a signal, namely, a different phase of the signal, or, alternatively, transmit an empty preamble block. The different phase is achieved by using a different phase of the PN code, typically in a quasi-orthogonal manner. However, if there are fewer transmit antennas, a different method or different combination of phases can provide better results.

So, for example, and not by way of limitation, sub-carrier 600B may transmit the preamble at a 1−j phase, whereas sub-carrier 600C may transmit the preamble at a −1+j phase. Such a scenario 604 allows for legacy support for those receivers that are expecting to see a signal at certain sub-carrier 600 frequencies, which corresponds to those sub-carrier 600 frequencies promulgated in scenario 602, which is the 802.11 standard. However, the present invention supports MIMO systems by transmitting the additional signals on the other sub-carriers 600, e.g., sub-carriers 600B and 600C.

Figure 7:
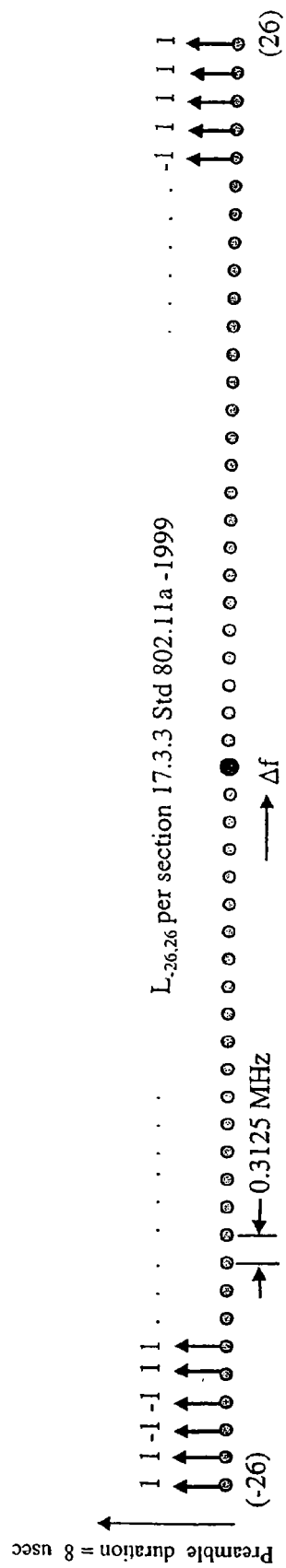
FIG. 7 illustrates a long preamble sequence in accordance with the present invention.

FIG. 7 illustrates a long preamble sequence in accordance with the present invention.

As with FIG. 6, subcarriers other than the standard sub-carriers transmit the preamble, but this time, at a 1 or −1 phase offset. Alternatively, the bits of the longer preamble can be transmitted sequentially by subcarriers 600 (other than center sub-carrier 600A, which is not used).

Transmit Spectrum and Expected Performance

Figure 8A:
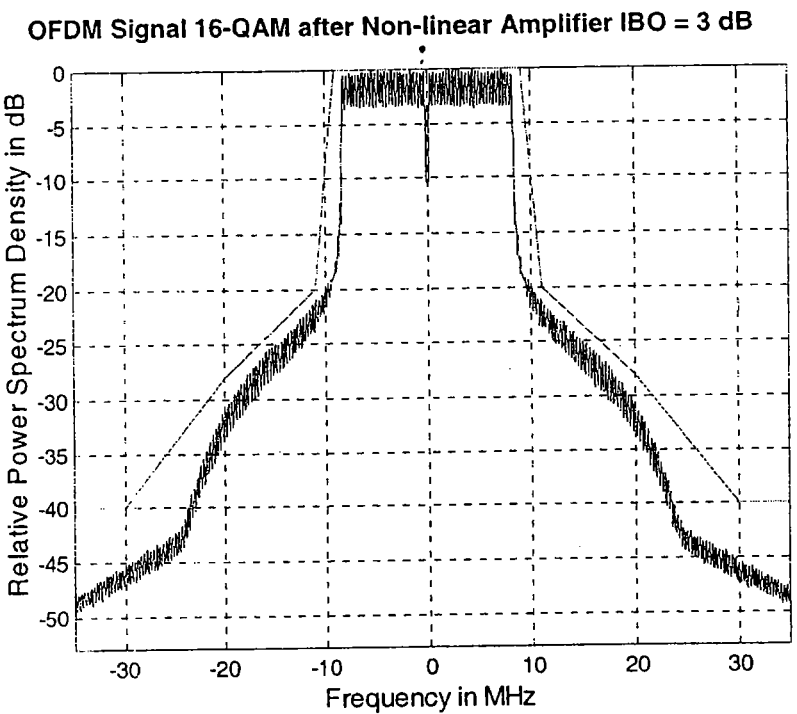
FIGS. 8A-B illustrate the transmit spectrum of the OFDM signal through the simulation model of the present invention.
Figure 8B:
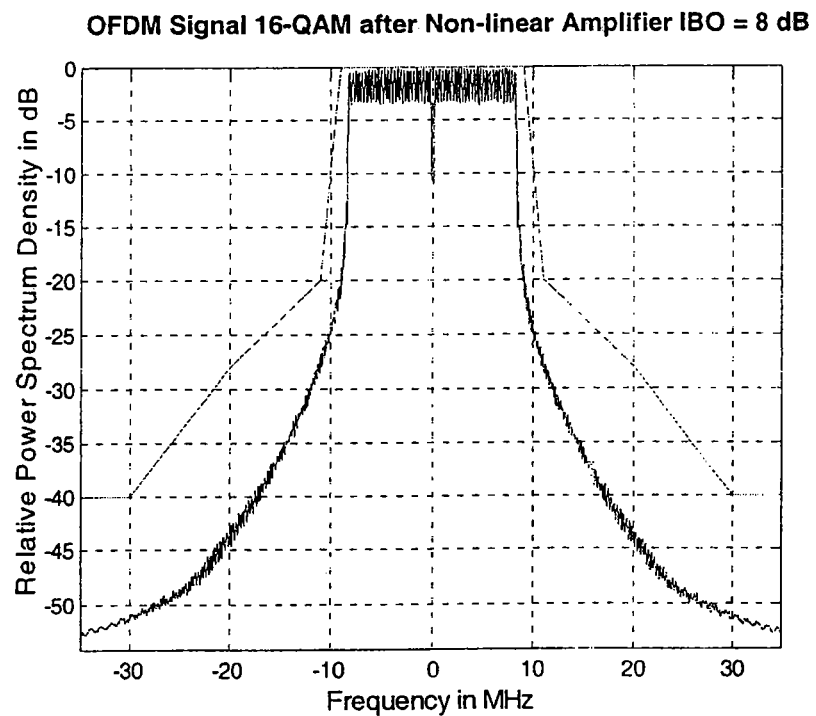

FIGS. 8A-B illustrate the transmit spectrum of the OFDM signal through the simulation model of the present invention.

Figure 9:
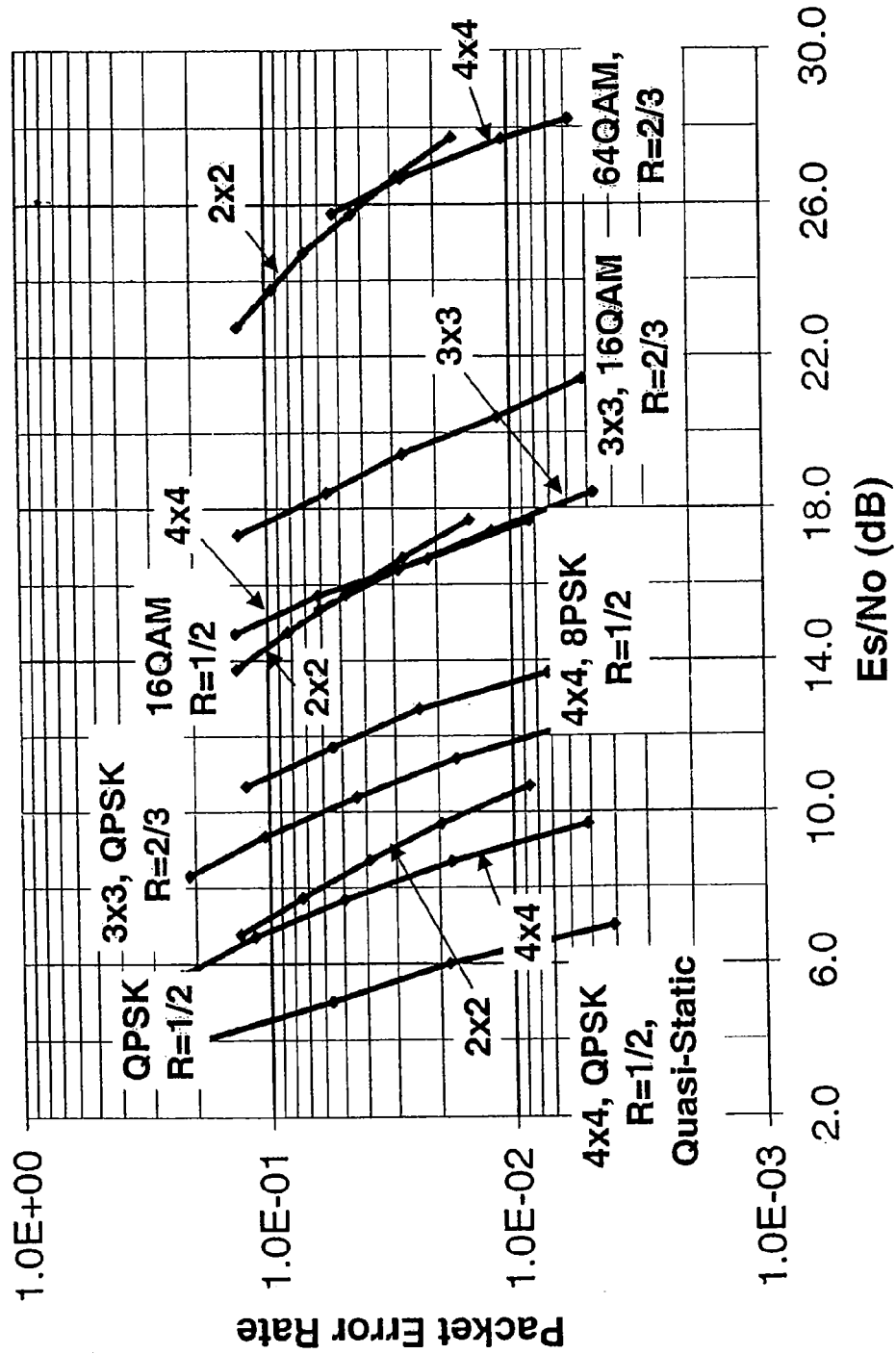
FIGS. 9-11 illustrate the modeled performance of the system of the present invention.
Figure 10:
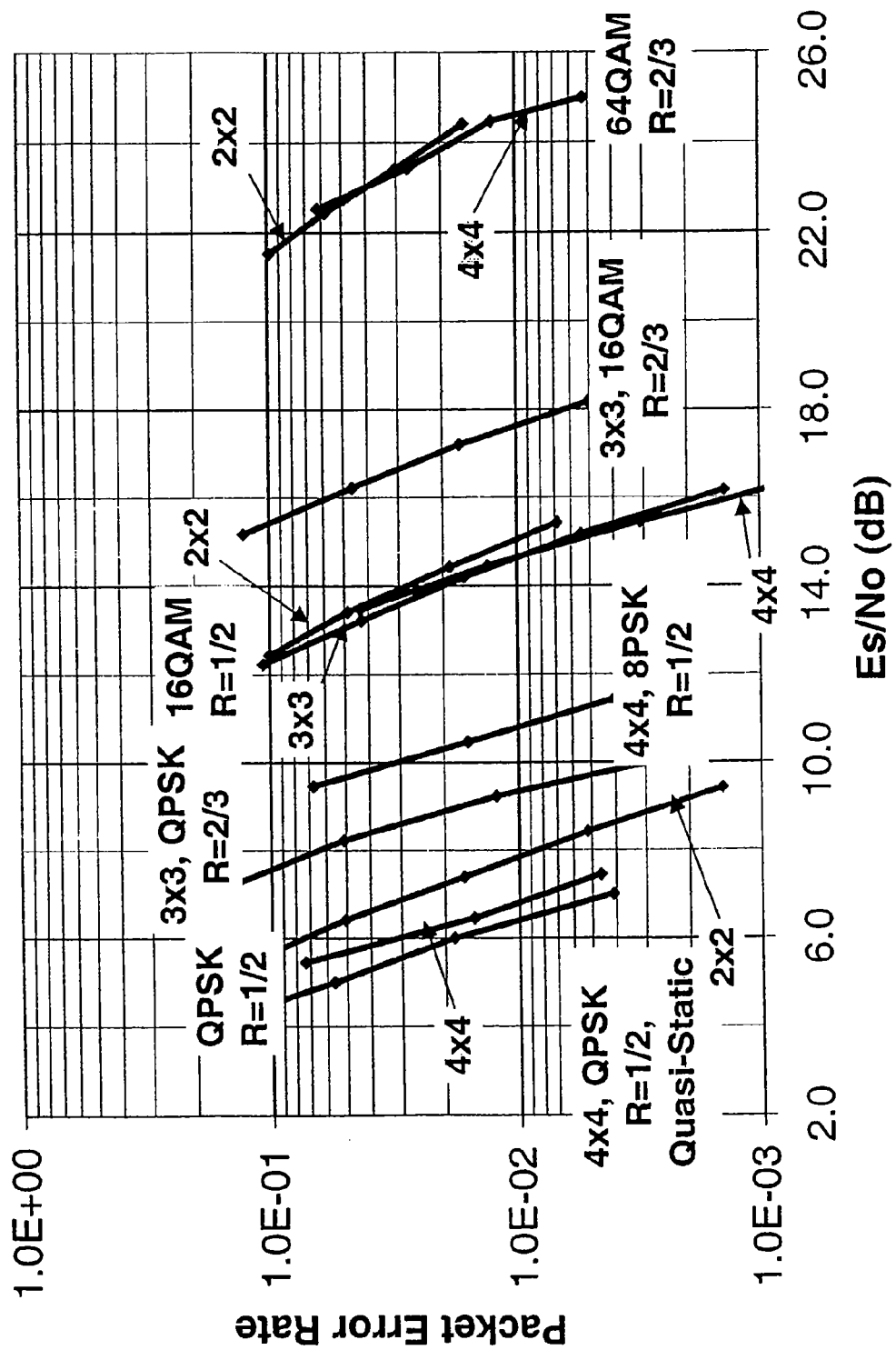
Figure 11:
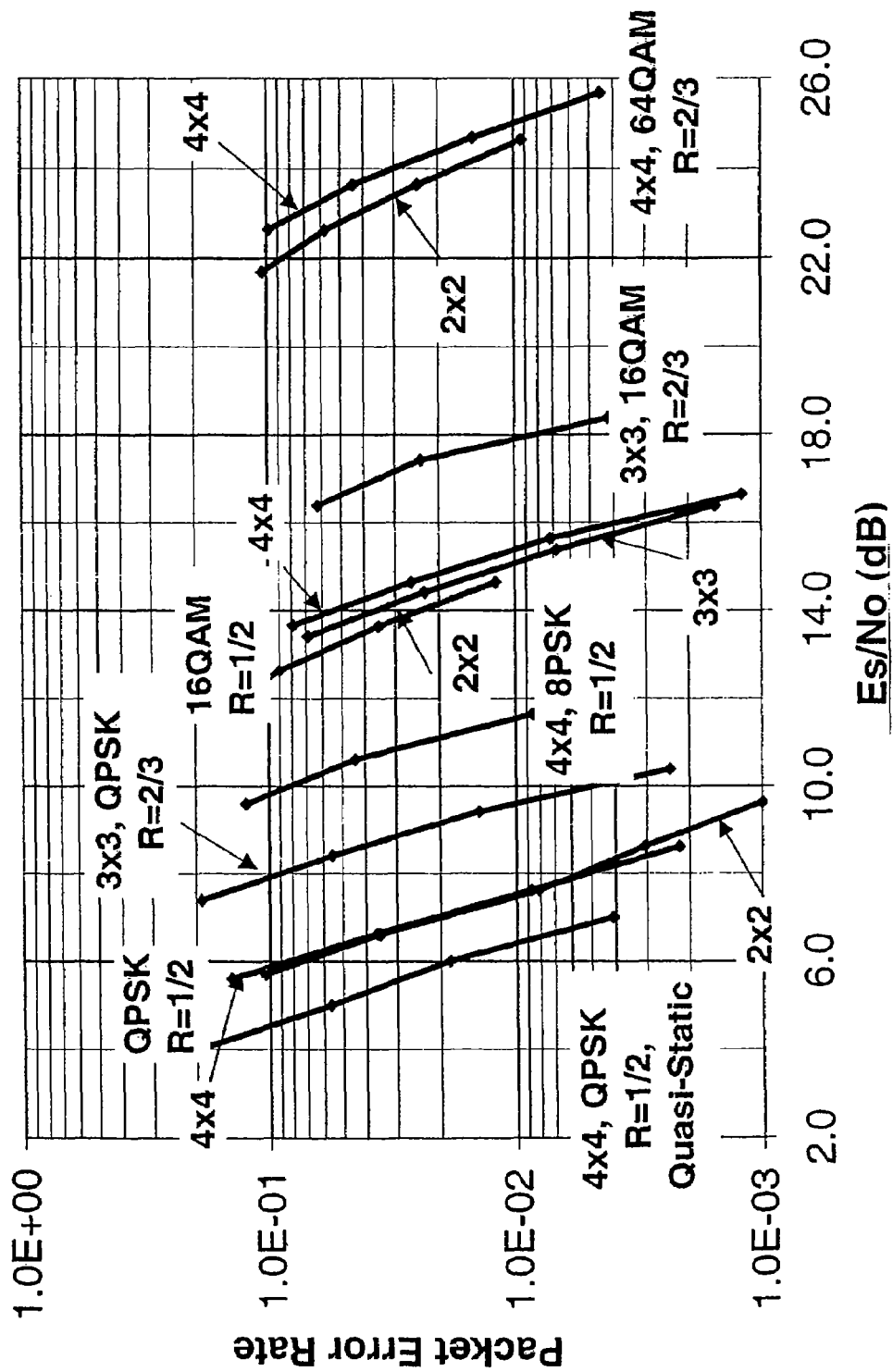

FIGS. 9-11 illustrate the modeled performance of the system of the present invention.

FIG. 9 illustrates the modeled performance of channel model "B" of a public address (PA) model for various coding schemas and code rates. A "4×4" graph indicates that there are four transmit antennas and four receive antennas, a "3×3" graph indicates that there are three transmit antennas and three receive antennas, and a "2×2" graph indicates that there are two transmit antennas and two receive antennas for that performance estimate. A Non-Line-Of-Sight (NLOS) model was used for the simulation. An antenna spacing of one-half wavelength was used.

FIG. 10 illustrates the modeled performance of channel model "D" of a public address (PA) model for various coding schemas and code rates. A "4×4" graph indicates that there are four transmit antennas and four receive antennas, a "3×3" graph indicates that there are three transmit antennas and three receive antennas, and a "2×2" graph indicates that there are two transmit antennas and two receive antennas for that performance estimate. A Non-Line-Of-Sight (NLOS) model was used for the simulation. The simulation also included a fluorescent light effect. An antenna spacing of one-half wavelength was used.

FIG. 11 illustrates the modeled performance of channel model "E" of a public address (PA) model for various coding schemas and code rates. A "4×4" graph indicates that there are four transmit antennas and four receive antennas, a "3×3" graph indicates that there are three transmit antennas and three receive antennas, and a "2×2" graph indicates that there are two transmit antennas and two receive antennas for that performance estimate. A Non-Line-Of-Sight (NLOS) model was used for the simulation. The simulation also included a fluorescent light effect. An antenna spacing of one-half wavelength was used.

Figure 12:
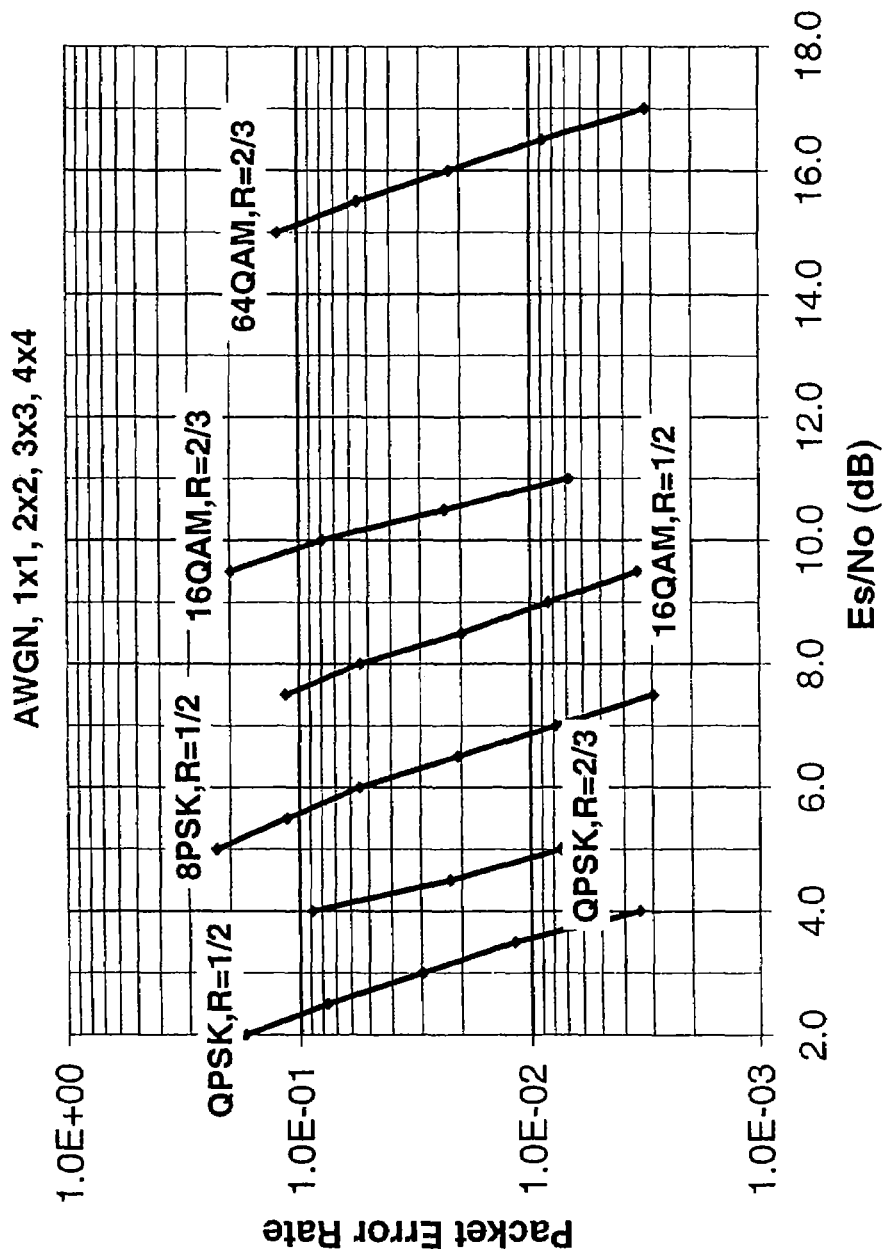
FIG. 12 illustrates the Additive White Gaussian Noise (AWGN) performance of MIMO systems of the present invention at various code schema and code rates.

FIG. 12 illustrates the Additive White Gaussian Noise (AWGN) performance of MIMO systems of the present invention at various code schema and code rates.

Figure 13:
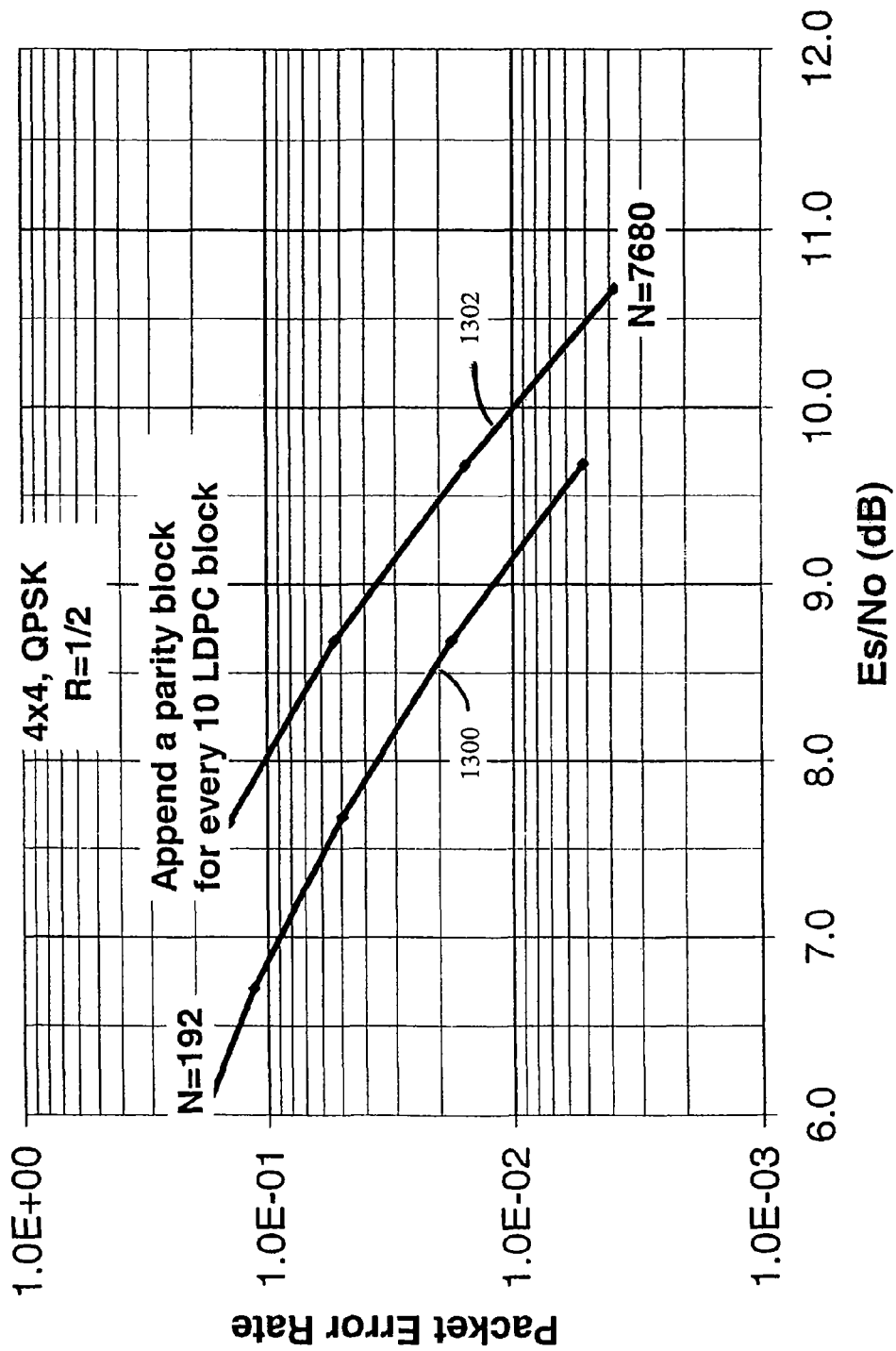
FIGS. 13-15 illustrate the performance of a MIMO system with and without appended parity blocks in accordance with the present invention.
Figure 14:
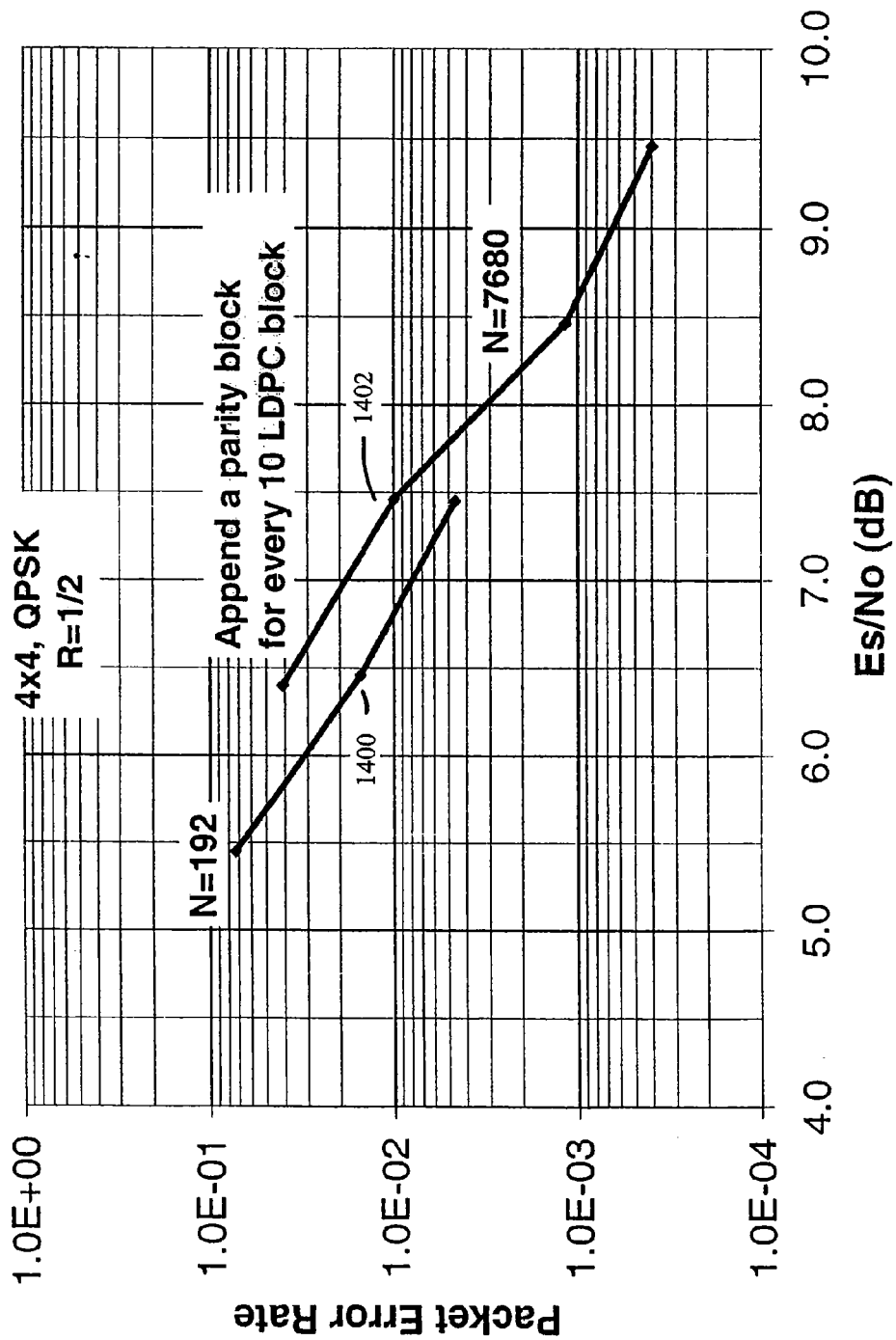
Figure 15:
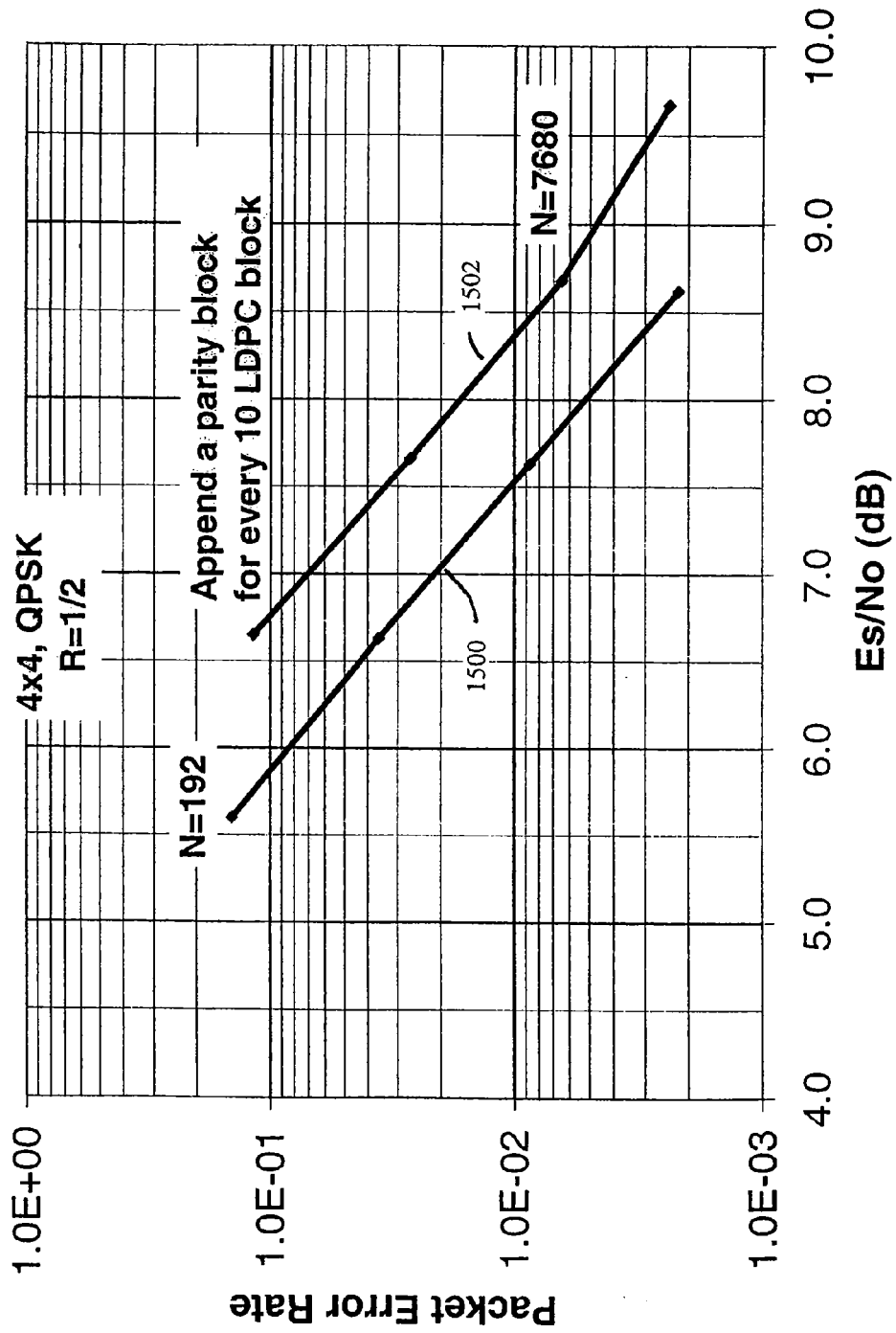

FIGS. 13-15 illustrate the performance of a MIMO system with and without appended parity blocks in accordance with the present invention.

FIG. 13 illustrates the modeled performance of channel model "B" of a PA model for a 4×4 QPSK, rate 1/2, MIMO system. Graph 1300 illustrates the LDPC code of n=192 bits in accordance with the present invention, and graph 1302 illustrates the effect of appending a parity block to the signal for every 10 LDPC blocks. Appending such a parity block shows that the Es/No required for a given error rate is much higher, typically approximately 1 dB. A Non-Line-Of-Sight (NLOS) model was used for the simulation. An antenna spacing of one-half wavelength was used.

FIG. 14 illustrates the modeled performance of channel model "D" of a public address (PA) model for a 4×4 QPSK, rate ½, MIMO system. Graph 1400 illustrates the LDPC code of n=192 bits in accordance with the present invention, and graph 1402 illustrates the effect of appending a parity block to the signal for every 10 LDPC blocks. Appending such a parity block shows that the Es/No required for a given error rate is slightly higher, typically approximately 0.5 dB. A Non-Line-Of-Sight (NLOS) model was used for the simulation. The simulation also included a fluorescent light effect. An antenna spacing of one-half wavelength was used.

FIG. 15 illustrates the modeled performance of channel model "E" of a public address (PA) model for a 4×4 QPSK, rate ½, MIMO system. Graph 1500 illustrates the LDPC code of n=192 bits in accordance with the present invention, and graph 1502 illustrates the effect of appending a parity block to the signal for every 10 LDPC blocks. Appending such a parity block shows that the Es/No required for a given error rate is slightly higher, typically approximately 0.7 dB. A Non-Line-Of-Sight (NLOS) model was used for the simulation. The simulation also included a fluorescent light effect. An antenna spacing of one-half wavelength was used.

Depending on the channel model applicable to a given installation, and the available power, appending a parity block may be appropriate for some MIMO system installations.

Flowchart

Figure 16:
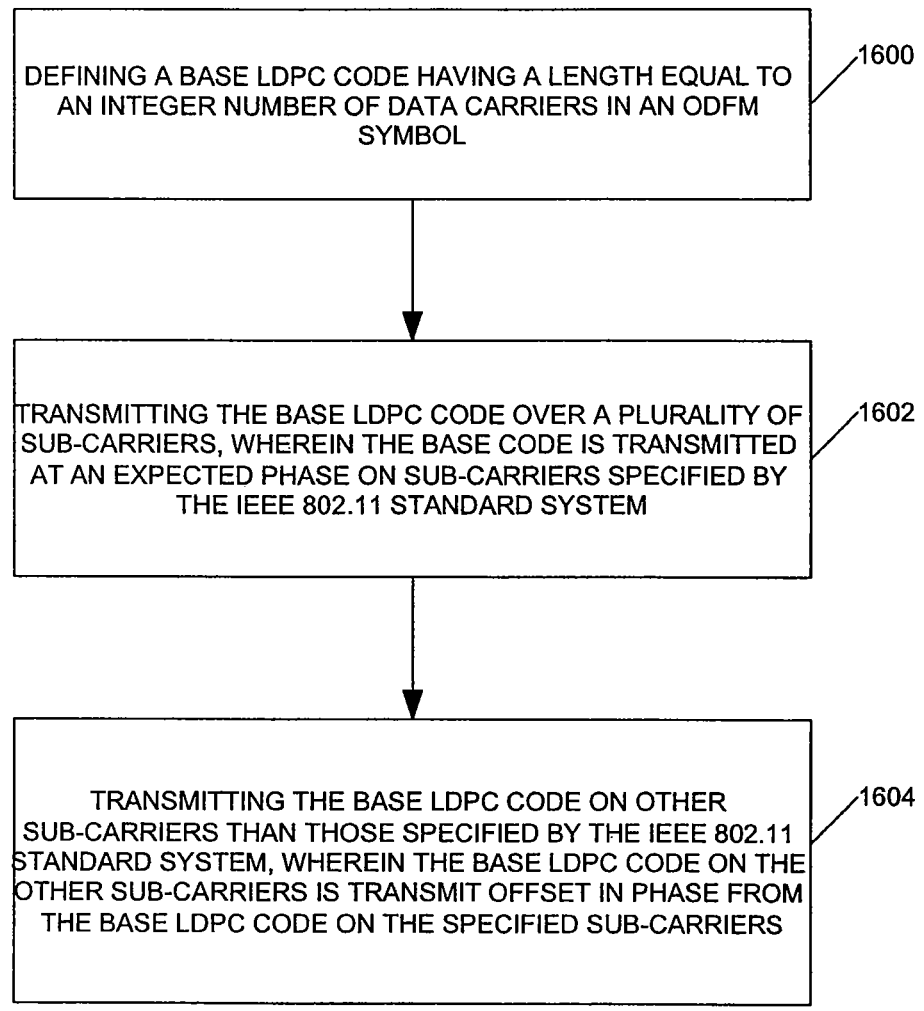
FIG. 16 is a flowchart illustrating a method in accordance with the present invention.

FIG. 16 is a flowchart illustrating a method in accordance with the present invention.

Box 1600 illustrates performing defining a base LDPC code, having a length equal to an integer number of data carriers in an ODFM symbol.

Box 1602 illustrates performing transmitting the base LDPC code over a plurality of sub-carriers, wherein the base code is transmitted at an expected phase on sub-carriers specified by the IEEE 802.11 standard system.

Box 1604 illustrates performing transmitting the base LDPC code on other sub-carriers than those specified by the IEEE 802.11 standard system, wherein the base LDPC code on the other sub-carriers is transmit offset in phase from the base LDPC code on the specified sub-carriers.

CONCLUSION

This concludes the description of the preferred embodiments of the present invention. The foregoing description of the preferred embodiment of the invention has been presented for the purposes of illustration and description. It is not intended to be exhaustive or to limit the invention to the precise form disclosed. Many modifications and variations are possible in light of the above teaching.

The present invention discloses a method and apparatus for implementing LDPC codes in an IEEE 802.11 standard system configured to operate in a Multiple-Input, Multiple-Output (MIMO) schema. A method in accordance with the present invention comprises defining a base LDPC code, having a length equal to an integer number of data carriers in an ODFM symbol, transmitting the base LDPC code over a plurality of sub-carriers, wherein the base code is transmitted at an expected phase on sub-carriers specified by the IEEE 802.11 standard system, and transmitting the base LDPC code on other sub-carriers than those specified by the IEEE 802.11 standard system, wherein the base LDPC code on the other sub-carriers is transmit offset in phase from the base LDPC code on the specified sub-carriers.

The method optionally includes a base LDPC code being 192 bits long, a length of the longer LDPC code is an integer multiple of the base LDPC code, the specified sub-carriers are transmitted by a first transmission antenna and the other sub-carriers are transmitted by at least one other antenna, and transmitting bits of the longer LDPC code sequentially on the specified sub-carriers and the other sub-carriers.

A system in accordance with the present invention comprises an encoder, for receiving a base LDPC code having a length equal to an integer number of data carriers in an ODFM symbol, and for encoding information bits using the LDPC code, a modulator, coupled to the encoder, for modulating the encoded information bits, and a transmitter, coupled to the modulator, for transmitting the modulated encoded information bits on a plurality of transmit antennas, wherein the modulated encoded information bits are transmitted on sub-carriers specified by an IEEE 802.11 standard system.

Such a system optionally includes a plurality of receive antennas for receiving the transmitted modulated encoded information bits, a detector, coupled to the antennas, for detecting the presence of the transmitted modulated encoded information bits, an LDPC decoder, coupled to the detector, for decoding the transmitted modulated encoded information bits, and a demodulator, coupled to the LDPC decoder, for demodulating the transmitted modulated encoded information bits, the base LDPC code being 192 bits long, a longer LDPC code, wherein a length of the longer LDPC code is an integer multiple of the base LDPC code, transmitting bits of the longer LDPC code sequentially on the specified sub-carriers and other sub-carriers, and the specified sub-carriers being transmitted by a first transmission antenna and other sub-carriers are transmitted by at least one other antenna.

It is intended that the scope of the invention be limited not by this detailed description, but rather by the claims appended hereto and the equivalents thereof. The above specification, examples and data provide a complete description of the manufacture and use of the composition of the invention. Since many embodiments of the invention can be made without departing from the spirit and scope of the invention, the invention resides in the claims hereinafter appended and the equivalents thereof.

TABLE 1

LDPC Code Parameters (n, k)

| Code Rate | LDPC Uncoded Block Length, k | LDPC Coded Block Length, n |
|---|---|---|
| 1/2 | 8000 | 16000 |
| 2/3 | 8000 | 12000 |
| 3/4 | 7200 | 9600 |
| 5/6 | 8000 | 9600 |

TABLE 2

Number of Bit Nodes of Various Degrees

| Code Rate | 13 | 12 | 8 | 3 | 2 | 1 |
|---|---|---|---|---|---|---|
| 1/2 | | | 4800 | 3200 | 7999 | 1 |
| 2/3 | 800 | | | 7200 | 3999 | 1 |
| 3/4 | | 800 | | 6400 | 2399 | 1 |
| 5/6 | 800 | | | 7200 | 1599 | 1 |

TABLE 3 q Values

| Code Rate | q |
|---|---|
| 2/3 | 10 |
| 1/2 | 20 |
| 3/4 | 6 |
| 5/6 | 4 |

What is claimed is:

1. A method for implementing Low Density Parity Check (LDPC) codes in an IEEE 802.11 standard system configured to operate in a Multiple-Input, Multiple-Output (MIMO) schema, comprising:
   a) defining a base LDPC code, having a length equal to an integer number of data carriers in an Orthogonal Frequency Division Multiplexing (OFDM) symbol;
   b) receiving the base LDPC code on a plurality of sub-carriers, wherein the base LDPC code is transmitted at an expected phase on sub-carriers specified by the IEEE 802.11 standard system, and
   c) receiving the base LDPC code on sub-carriers other than those specified by the IEEE 802.11 standard system, wherein the base LDPC code on the other sub-carriers is transmitted offset in phase from the base LDPC code on the specified sub-carriers.

2. The method of claim 1, wherein the base LDPC code is 192 bits long.

3. The method of claim 1, further comprising using a longer LDPC code, wherein a length of the longer LDPC code is an integer multiple of the base LDPC code.

4. The method of claim 3, further comprising transmitting bits of the longer LDPC code sequentially on the specified sub-carriers and the other sub-carriers.

5. The method of claim 1, wherein the specified sub-carriers are transmitted by a first transmission antenna and the other sub-carriers are transmitted by at least one other antenna.

6. A Low Density Parity Check (LDPC) coded, IEEE 802.11 compatible Multiple-Input, Multiple-Output (MIMO) broadcast system, comprising:
- a receiver for receiving a signal on a plurality of receive antennas, the signal encoded with a base LDPC code having a length equal to an integer number of data carriers in an Orthogonal Frequency Division Multiplexing (OFDM) symbol, and for decoding information bits using the base LDPC code;
- a demodulator, coupled to the receiver, for demodulating the signals; and
- a decoder, coupled to the demodulator, for decoding the demodulated signals into information bits, wherein the demodulated decoded information bits are transmitted to the receiver on sub-carriers specified by an IEEE 802.11 standard system and on sub-carriers other than those specified by the IEEE 802.11 standard system, wherein transmissions on the sub-carriers other than those specified by the IEEE 802.11 standard system are offset in phase from transmissions on the sub-carriers specified by the IEEE 802.11 standard system.

7. The LDPC coded, IEEE 802.11 compatible MIMO broadcast system of claim 6, wherein the base LDPC code is 192 bits long.

8. The LDPC coded, IEEE 802.11 compatible MIMO broadcast system of claim 6, further comprising using a longer LDPC code, wherein a length of the longer LDPC code is an integer multiple of the base LDPC code.

9. The LDPC coded, IEEE 802.11 compatible MIMO broadcast system of claim 8, further comprising bits of the longer LDPC code being sequentially received on the specified sub-carriers and other sub-carriers.

10. The LDPC coded, IEEE 802.11 compatible MIMO broadcast system of claim 6, wherein the specified sub-carriers are transmitted by a first antenna and other sub-carriers are transmitted by at least one other antenna.

11. A method for implementing Low Density Parity Check (LDPC) codes in a Multiple-Input, Multiple-Output (MIMO) system, comprising:
- a) transmitting a base LDPC code of length equal to an integer number of data carriers over a plurality of sub-carriers at an expected phase on sub-carriers specified by the IEEE 802.11 standard system, and
- b) transmitting the base LDPC code on sub-carriers other than those specified by the IEEE 802.11 standard system offset in phase from the base LDPC code on the specified sub-carriers.

12. The method of claim 11, wherein the base LDPC code is 192 bits long.

13. The method of claim 11, further comprising transmitting a longer LDPC code, wherein a length of the longer LDPC code is an integer multiple of the base LDPC code.

14. The method of claim 13, further comprising transmitting bits of the longer LDPC code sequentially on the IEEE 802.11 standard sub-carriers and the other sub-carriers.

15. The method of claim 11, wherein the IEEE 802.11 standard sub-carriers are transmitted by a first antenna and the other sub-carriers are transmitted by at least one other antenna.

16. A broadcast system, comprising:
- an encoder, for encoding a signal in the broadcast system using a base Low Density Parity Check (LDPC) code having a length equal to an integer number of data carriers in the broadcast system,
- a modulator, coupled to the encoder, for modulating the LDPC encoded signal; and
- a transmitter, coupled to the modulator, for transmitting the modulated LDPC encoded signal on a plurality of transmit antennas, wherein the modulated LDPC encoded signal is transmitted on IEEE 802.11 standard sub-carriers in an expected phase and on other sub-carriers at a phase offset from the expected phase.

17. The broadcast system of claim 16, wherein the base LDPC code is 192 bits long.

18. The broadcast system of claim 16, wherein the encoder further encodes the signal using a longer LDPC code, wherein a length of the longer LDPC code is an integer multiple of the base LDPC code.

19. The broadcast system of claim 18, wherein bits of the longer LDPC code are sequentially transmitted on the IEEE 802.11 standard sub-carriers and the other sub-carriers.

20. The broadcast system of claim 16, wherein the IEEE 802.11 standard sub-carriers are transmitted by a first antenna and other sub-carriers are transmitted by at least one other antenna.

* * * * *